US010937926B2

(12) United States Patent
Lin et al.

(10) Patent No.: US 10,937,926 B2
(45) Date of Patent: Mar. 2, 2021

(54) LIGHT-EMITTING DIODES WITH BUFFER LAYERS

(71) Applicant: Xiamen Changelight Co., Ltd., Fujian (CN)

(72) Inventors: Zhiwei Lin, Fujian (CN); Kaixuan Chen, Fujian (CN); Yong Zhang, Fujian (CN); Xiangjing Zhuo, Fujian (CN); Wei Jiang, Fujian (CN); Yang Wang, Fujian (CN); Jichu Tong, Fujian (CN); Tianzu Fang, Fujian (CN)

(73) Assignee: Xiamen Changelight Co., Ltd., Xiamen (CN)

( * ) Notice: Subject to any disclaimer, the term of this patent is extended or adjusted under 35 U.S.C. 154(b) by 0 days.

(21) Appl. No.: 16/317,694

(22) PCT Filed: Jul. 14, 2017

(86) PCT No.: PCT/IB2017/054289
§ 371 (c)(1),
(2) Date: Jan. 14, 2019

(87) PCT Pub. No.: WO2018/011769
PCT Pub. Date: Jan. 18, 2018

(65) Prior Publication Data
US 2019/0296189 A1 Sep. 26, 2019

(30) Foreign Application Priority Data

Jul. 15, 2016 (CN) .......................... 201610557325.9

(51) Int. Cl.
*H01L 33/12* (2010.01)
*H01L 33/00* (2010.01)
(Continued)

(52) U.S. Cl.
CPC .......... *H01L 33/12* (2013.01); *H01L 21/0242* (2013.01); *H01L 21/0254* (2013.01);
(Continued)

(58) Field of Classification Search
CPC ............... H01L 33/12; H01L 21/02507; H01L 21/02458; H01L 21/0254; H01L 33/32; H01L 33/007; H01L 33/0075
See application file for complete search history.

(56) References Cited

U.S. PATENT DOCUMENTS 5,741,724 A 4/1998 Ramdani et al.
8,704,207 B2 * 4/2014 Yanagihara ....... H01L 29/66462
257/12
(Continued)

FOREIGN PATENT DOCUMENTS

CN 1706030 A 12/2005
CN 102891174 A 1/2013
(Continued)

OTHER PUBLICATIONS

International Preliminary Report on Patentability issued in PCT/IB2017/054289 dated Jan. 24, 2019, 6 pages.
(Continued)

*Primary Examiner* — Julia Slutsker
(74) *Attorney, Agent, or Firm* — Arch & Lake LLP

(57) ABSTRACT

A semiconductor wafer includes a substrate (1), a buffer layer (2) deposited on the substrate (1), and an epitaxial layer (4) above the buffer layer (2). The buffer layer (2) includes a plurality of semiconductor material layers (22) and a plurality of oxygen-doped material layers (21). The semiconductor material layers (22) and the oxygen-doped material layers (21) are deposited in an alternating arrangement on top of each other. Oxygen concentrations of the oxygen-doped material layers (21) gradually decrease along a direction from the substrate (1) to the epitaxial layer (4).

10 Claims, 2 Drawing Sheets

(51) Int. Cl.
*H01L 33/32* (2010.01)
*H01L 21/02* (2006.01)

(52) U.S. Cl.
CPC .. *H01L 21/02458* (2013.01); *H01L 21/02507* (2013.01); *H01L 21/02631* (2013.01); *H01L 33/007* (2013.01); *H01L 33/32* (2013.01)

(56) References Cited

U.S. PATENT DOCUMENTS

| | | | |
|---|---|---|---|
| 9,117,743 B2* | 8/2015 | Komiyama | H01L 29/2003 |
| 9,142,407 B2* | 9/2015 | Chen | H01L 21/0254 |
| 2013/0069076 A1* | 3/2013 | Iwami | H01L 21/02381 257/76 |
| 2014/0231817 A1* | 8/2014 | Arkun | H01L 21/02488 257/76 |

FOREIGN PATENT DOCUMENTS

| | | |
|---|---|---|
| CN | 105755536 A | 7/2016 |
| CN | 106025026 A | 10/2016 |
| JP | 2006-004970 A | 1/2006 |

OTHER PUBLICATIONS

International Search Report and Written Opinion for International Application No. PCT/IB2017/054289, dated Nov. 1, 2017, 9 pages.
Kumakura et al., "Growth of GaN on sapphire substrates using novel buffer layers of ECR-plasma-sputtered $Al_2O_3$/graded-AlON/AlN/$Al_2O_3$," Journal of Crystal Growth, vol. 292, Jun. 12, 2006, 4 pages.

* cited by examiner

LIGHT-EMITTING DIODES WITH BUFFER LAYERS

CROSS-REFERENCE TO RELATED APPLICATIONS

This application is a 371 U.S. National Stage Application of International Application No. PCT/IB2017/054289, filed Jul. 14, 2017, which claims priority to Chinese Patent Application 201610557325.9, filed Jul. 15, 2016, which is incorporated herein by reference in its entirety.

BACKGROUND

Light-emitting diode (LED) chips may be manufactured by depositing various layers of GaN material on a substrate. The substrate contains a material that is different form the GaN material. The lattice mismatch between the GaN material and the material of the substrate significantly reduces the crystal quality of the GaN material, which negatively affects the luminescent efficiency of the LEDs.

SUMMARY

In an aspect according to some embodiments of the present disclosure, a semiconductor wafer includes a substrate, a buffer layer deposited on the substrate, and an epitaxial layer above the buffer layer. The buffer layer includes a plurality of semiconductor material layers and a plurality of oxygen-doped material layers. The semiconductor material layers and the oxygen-doped material layers are deposited in an alternating arrangement on top of each other. Oxygen concentrations of the oxygen-doped material layers gradually decrease along a direction from the substrate to the epitaxial layer.

In another aspect according to some embodiments of the present disclosure, a method of fabricating a semiconductor device includes forming a buffer layer by alternatingly depositing a plurality of semiconductor material layers and a plurality of oxygen-doped material layers on a substrate, and disposing an epitaxial layer above the buffer layer. The oxygen concentrations of the oxygen-doped material layers gradually decrease along a direction from the substrate to the epitaxial layer.

In yet another aspect according to some embodiments of the present disclosure, a light-emitting diode (LED) chip includes a sapphire substrate, a buffer layer deposited on the sapphire substrate, and an epitaxial layer includes gallium nitride (GaN) above the buffer layer. The buffer layer includes a plurality of aluminum nitride (AlN) layers and a plurality of oxygen-containing AlN layers. The AlN material layers and the oxygen-containing AlN layers are deposited in an alternating arrangement on top of each other. The epitaxial layer includes gallium nitride (GaN).

Other aspects and embodiments of this disclosure are also contemplated. The foregoing summary and the following detailed description are not meant to restrict this disclosure to any particular embodiment but are merely meant to describe some embodiments of this disclosure.

BRIEF DESCRIPTION OF THE DRAWINGS

For a better understanding of the nature and objects of some embodiments of this disclosure, reference should be made to the following detailed description taken in conjunction with the accompanying drawings.

DETAILED DESCRIPTION

In order to improve the crystal quality of epitaxial material for light-emitting diodes (LEDs), an electronic device or an optoelectronic device based on gallium nitride (GaN) may include one or more aluminum nitride (AlN) buffer layers deposited by reactive sputtering. The reactive sputtering involves reacting an aluminum-containing target material placed in a physical vapor deposition (PVD) chamber with a nitrogen-containing gas or a plasma based on a nitrogen-containing gas. Oxygen is introduced into the PVD chamber during the reaction. A GaN material is subsequently grown on top of the AlN buffer layer using metalorganic chemical vapor deposition (MOCVD). Compared to a lattice mismatch between the GaN material and the substrate, the lattice matching is improved between the GaN material and the AlN buffer layer. Thus, the AlN buffer layer reduces the material stress caused by lattice mismatch, and therefore improves the crystal quality of epitaxial material for light-emitting diodes grown on top of the AlN buffer layer.

However, because the oxygen is introduced during the reactive sputtering, the density of the AlN material grown by the PVD process is reduced. At a beginning stage of the subsequent MOCVD process, the temperature of the AlN material is increased before the GaN material starts to grow epitaxially. The high temperature heating process reduces the thickness of the AlN layer, and causes a recrystallization that leads to an uneven interface for the AlN layer. Because the AlN layer serves as a buffer layer for the epitaxial material, the thin and uneven buffer layer may increase the dislocation density of the subsequently grown epitaxial material. The increased dislocation density reduces the luminescent efficiency of the LEDs and negatively affects the reliability of the LEDs.

According to at least some embodiments of the present disclosure, an LED device including one or more buffer layers (e.g., AlN buffer layers) and a method manufacturing such an LED device are described. The disclosed buffer layers have a high density and effectively release the stress between the buffer layers and the substrate. Because the stress of the buffer layers is released, the crystal quality of the epitaxial material (e.g., GaN) subsequently grown on the buffer layers can be improved.

Figure 1:
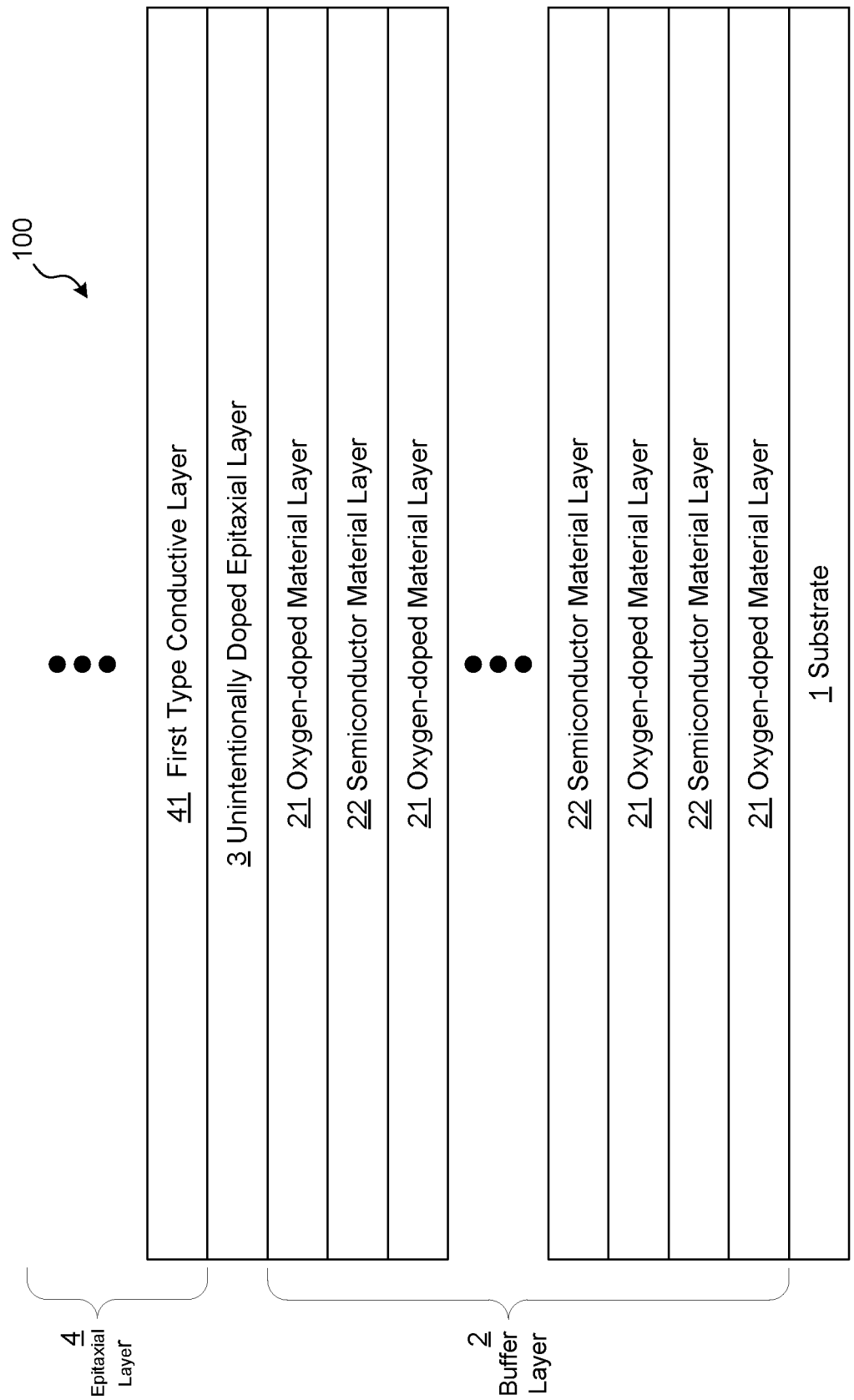
FIG. 1 schematically illustrates a semiconductor device including a buffer layer, according to various embodiments of the present disclosure.

FIG. 1 illustrates a device 100 including a buffer layer, according to some embodiments of the present disclosure. The device 100 may be, e.g., a wafer (e.g., epitaxial wafer) or a substrate for manufacturing one or more LED chips. The device 100 includes a substrate 1, a buffer layer 2, optionally an unintentionally doped epitaxial layer 3 and an epitaxial layer 4. The substrate 1 may be, e.g., a sapphire ($Al_2O_3$) substrate.

The buffer layer 2 is deposited on the substrate 1. The unintentionally doped epitaxial layer 3 and the epitaxial layer 4 are deposited on the buffer layer 2. The epitaxial layer 4 can include one or more layers, such as the first type conductive layer 41. The epitaxial layer 4 may further include additional layers (e.g., second type conductive layer and/or quantum wells layer, etc.) on top of the first type conductive layer 4 for forming an epitaxial wafer for manufacturing LEDs.

The buffer layer 2 may include semiconductor materials such as AlN. The buffer layer 2 may include semiconductor material layers 22 (e.g., AlN layers) and oxygen-doped material layers 21 (e.g., oxygen-doped AlN layers) that are deposited on each other in an alternating arrangement. The buffer layer 2 can include one or more deposition cycles. Except for a last deposition cycle, a semiconductor material layer 22 and an oxygen-doped material layer 21 immediately on that semiconductor material layer 22 form a deposition cycle.

As shown in FIG. 1, an oxygen-doped material layer 21 is deposited on the substrate 1. A semiconductor material layer 22 is deposited on the oxygen-doped material layer 21. Another oxygen-doped material layer 21 is deposited on the semiconductor material layer 22, and so on. The semiconductor material layers 22 and oxygen-doped material layers 21 are deposited on each other in an alternating manner. In a last deposition cycle, a last oxygen-doped material layer 21 is deposited as a top layer of the buffer layer 2, without further depositing another semiconductor material layer 22. In other words, the last deposition cycle includes an oxygen-doped material layer 21, but does not include a semiconductor material layer 22. The last oxygen-doped material layer 21 is in direct contact with the unintentionally doped epitaxial layer 3. In some other embodiments, the device 100 does not include an unintentionally doped epitaxial layer 3 and the last oxygen-doped material layer 21 is in direct contact with the epitaxial layer 4.

Figure 2:
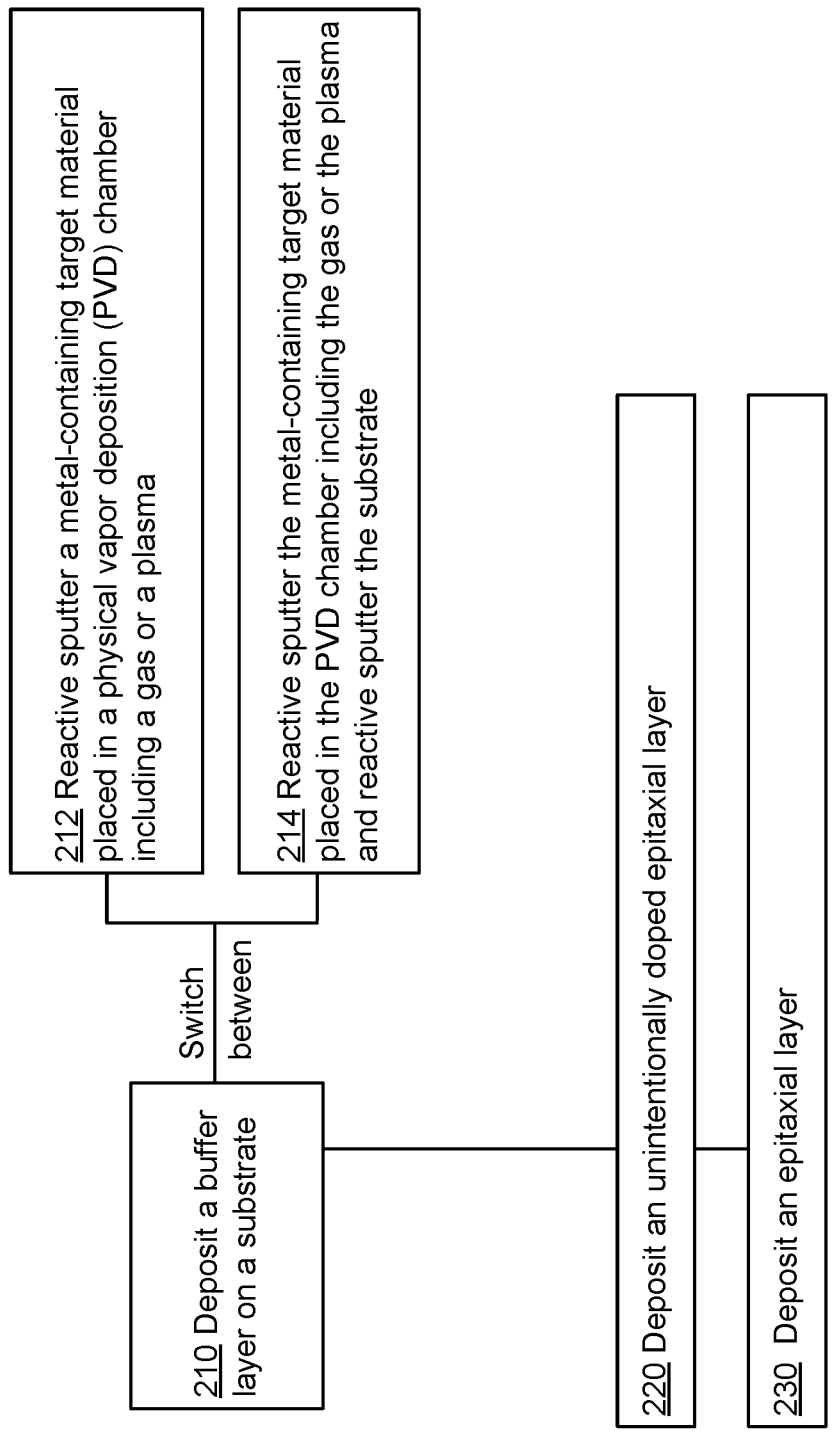
FIG. 2 schematically illustrates an example process of fabricating a semiconductor device including a buffer layer, according to various embodiments of the present disclosure.

In some embodiments, the deposition cycles of the buffer layer 2 are created by a PVD process. FIG. 2 schematically illustrates an example process of fabricating a semiconductor device including a buffer layer using, e.g., a PVD process. At step 210 of the process 200, the process forms a buffer layer by alternatingly depositing a plurality of semiconductor material layers and a plurality of oxygen-doped material layers on a substrate. During the step 210, the process may switch between steps of 212 and 214 in a continuous manner. During step 212, the process performs reactive sputtering a metal-containing target material placed in a physical vapor deposition (PVD) chamber including a gas or a plasma. During step 214, the process performs reactive sputtering the metal-containing target material placed in the PVD chamber including the gas or the plasma and reactive sputtering the substrate.

After the buffer layer is formed, at step 220, an unintentionally doped epitaxial layer is deposited on the buffer layer. At step 230, an epitaxial layer is deposited on the unintentionally doped epitaxial layer and above the buffer layer.

In other words, a deposition of a semiconductor material layer 22 (e.g., an AlN layer) involves a reactive sputtering a metal-containing (e.g., aluminum) target material placed in a physical vapor deposition (PVD) chamber with a gas (e.g., nitrogen-containing gas) or a plasma (e.g., plasma based on a nitrogen-containing gas). A deposition of an oxygen-doped material layer 21 (e.g., an oxygen-doped AlN layer) involves a reactive sputtering a metal-containing (e.g., aluminum) target material placed in a physical vapor deposition (PVD) chamber with a gas (e.g., nitrogen-containing gas) or a plasma (e.g., plasma based on a nitrogen-containing gas), as well as a reactive sputtering the sapphire substrate 1. The reactive sputtering of the sapphire substrate 1 releases the oxygen from the substrate 1 and incorporates the oxygen into the oxygen-doped material layer 21. Therefore, by resuming and stopping the reactive sputtering of the sapphire substrate 1, the PVD process can switch between depositing the semiconductor material layers 22 and depositing the oxygen-doped material layers 21 within the deposition cycles. The semiconductor material layers 22 and the oxygen-doped material layers 21 are deposited in an alternating manner without any gaps in between.

In some embodiments, the thickness of the semiconductor material layer 22 may be greater than the thickness of the oxygen-doped semiconductor material layer 21. A thickness of a deposition cycle (except a last deposition cycle), which includes a semiconductor material layer 22 and an oxygen-doped material layer 21, may be from about 4 nanometers (nm) to about 10 nm. The thickness of the entire buffer layer 2 may be, from about 15 nm to about 50 nm. The oxygen-doped material layers 21 may include oxygen with a concentration of from about 1E18 to about 1E23 $cm^{-3}$. In some embodiments, the oxygen concentration of the oxygen-doped material layers 21 may gradually decrease along an upward direction as illustrated in FIG. 1. In other words, the oxygen-doped material layers 21 closer to the substrate 1 may contain more oxygen than other oxygen-doped material layers 21 that are closer to the epitaxial layer 4.

According to at least some embodiments of the present disclosure, the buffer layer including the semiconductor material (e.g., AlN) is grown using a PVD process that is similar to the superlattice growth. The switching between depositing the semiconductor material layers 22 and depositing the oxygen-doped material layers 21 can be realized by stopping and resuming the reactive sputtering of the sapphire substrate. There is no gap period between the depositions of the layers 21 and 22, which are continuously grown. Thus, the time period of the grown is reduced or minimized. The continuous growth, without stopping the deposition, improves the crystal quality.

The buffer layer 2 includes an alternating arrangement of the semiconductor material layers 22 (e.g., AlN layers) and oxygen-doped material layers 21 (e.g., oxygen-doped AlN layers). The doping of oxygen may reduce the density of the material in the oxygen-doped material layers 21. The insertion of the semiconductor material layers 22 (without oxygen doping) between the oxygen-doped material layers 21 improves the overall density of the buffer layer 2. Furthermore, the alternating arrangement of the semiconductor material layers 22 (e.g., AlN layers) and oxygen-doped material layers 21 (oxygen-doped AlN layers) helps releasing the stress between the buffer layer 2 and the sapphire substrate 1. Because the stress of the buffer layers is released, the crystal quality of the epitaxial material (e.g., GaN) subsequently grown on the buffer layers is improved.

In some embodiments, the first layer within the buffer layer 2, which is in direct contact with the substrate 1, may be an oxygen-doped material layer 21 (e.g., oxygen-doped AlN layer). The arrangement achieves a smooth transition of lattice from the substrate to the semiconductor material layer 22 (e.g., AlN layer) and reduces the stress between layers of different materials.

In some embodiments, the last layer within the buffer layer 2, which is in direct contact with the unintentionally doped epitaxial layer 3 (or the epitaxial layer 4), may be an oxygen-doped material layer 21 (e.g., oxygen-doped AlN layer). The last oxygen-doped material layer 21 improves the lattice matching between the semiconductor material (e.g., AlN) of the buffer layer 2, and a different semiconductor material (e.g., GaN) of the unintentionally doped epitaxial layer 3 or the epitaxial layer 4. In other words, the degree of mismatch between the AlN material and the GaN material is reduced. Although the AlN material approximately matches the GaN material, a 2.5% of degree of mismatch may still exist. The buffer layer doped by the oxygen improves the matching between the AlN material and GaN material. As a result, the epitaxial material (e.g., GaN) grown on the buffer layer 2 may achieve a better crystal quality.

In some embodiments, oxygen diffusion (e.g., from layer 21 to layer 22) may further reduce the thickness of the semiconductor material layer 22 (which does not contain oxygen or oxide). To mitigate the effect of oxygen diffusion, the thickness of the semiconductor material layer 22 may be greater than the thickness of the oxygen-doped semiconductor material layer 21. A thickness of a deposition cycle, which includes a semiconductor material layer 22 and an oxygen-doped material layer 21, may be greater than 4 nm such that the PVD can effectively control the thickness of the deposition cycle. The thickness of the deposition cycle may be less than 10 nm to improve the stress release between layers.

In some embodiments, the oxygen-doped material layers 21 may include oxygen with a concentration of from about 1E18 to about 1E23 $cm^{-3}$. The oxygen concentration of the oxygen-doped material layers 21 may decrease along a direction from the substrate to the epitaxial material, as illustrated in FIG. 1. By adjusting the oxygen concentration, the oxygen-doped material layers 21 are optimized for lattice matching between layers. The oxygen-doped material layers 21 closer to the substrate 1 may contain more oxygen for a better lattice matching between the sapphire material ($Al_2O_3$) of the substrate 1 and the oxygen-doped AlN material in layers 21. Thus, the stress due to the lattice mismatch is reduced. By gradually deceasing the oxygen concentration in the oxygen-doped material layers 21 along the upward direction, the stress within the buffer layer 2 is reduced, until a last oxygen-doped material layers 21 with a lattice closely matching the GaN of the epitaxial material. Thus, an AlN buffer layer with a high density is achieved. Furthermore, the stress due to the lattice mismatch between the GaN of the epitaxial material and AlN of the buffer layer is effectively reduced. Those advantages lead to a high-quality epitaxial material for manufacturing LEDs.

Although various examples described and illustrated herein disclose that various layers include semiconductor materials (undoped, n-doped, or p-doped semiconductors) such as gallium nitride (GaN) and/or aluminum nitride (AlN), it is to be understood that the technology disclosed herein may be applied to chips including other types of semiconductor materials, such as indium nitride (InN), gallium arsenide (GaAs), aluminum arsenide (AlAs), indium arsenide (InAs), aluminum phosphide (AlP), gallium phosphide (GaP), indium phosphide (InP), aluminum antimonide (AlSb), gallium antimonide (GaSb), indium antimonide (InSb), or any compound or alloy thereof (e.g., AlGaN, GaInN, AlInN, AlGaInN, AlGaAs, GaInAs, AlInAs, AlGaInAs, AlInP, GaInP, AlGaInP, AlInSb, GaInSb, AlGaSb, AlGaInSb, etc.). In other words, the semiconductor material may be formed of, or at least include, e.g., a nitride compound, an alloy of nitride compounds, an arsenide compound, an alloy of arsenide compounds, a phosphide compound, an alloy of phosphide compounds, an antimonide compound, an alloy of antimonide compounds, a ternary alloy of group III elements and group V elements, or a quaternary alloy of group III elements and group V elements.

As used herein, the singular terms "a," "an," and "the" may include plural referents unless the context clearly dictates otherwise.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two numerical values can be deemed to be "close to" each other if a difference between the values is less than or equal to ±20% of an average of the values, such as less than or equal to ±10%, less than or equal to ±5%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor wafer, comprising:
   a substrate;
   a buffer layer deposited on the substrate, the buffer layer including a plurality of semiconductor material layers and a plurality of oxygen-doped material layers, the semiconductor material layers and the oxygen-doped material layers deposited in an alternating arrangement on top of each other, wherein the buffer layer releases a stress between the buffer layer and the substrate, the plurality of oxygen-doped material layers include a last oxygen-doped material layer, and a thickness of the last oxygen-doped material layer is no greater than the thickness of the semiconductor material layers; and
   an epitaxial layer above the buffer layer, wherein the last oxygen-doped material layer is in direct contact with the epitaxial layer, and wherein an oxygen concentration of each oxygen-doped material layer of the plurality of oxygen-doped material layers gradually decreases along a direction from the substrate to the epitaxial layer.

2. The semiconductor wafer of claim 1, wherein the semiconductor material layers include aluminum nitride (AlN) layers, and the oxygen-doped material layers include oxygen-doped AlN layers.

3. The semiconductor wafer of claim 1, wherein the substrate includes aluminum oxide ($Al_2O_3$), and the epitaxial layer includes gallium nitride (GaN).

4. The semiconductor wafer of claim 1, wherein the buffer layer includes a first oxygen-doped material layer among the plurality of oxygen-doped material layers, the first oxygen doped material layer is in direct contact with the substrate.

5. The semiconductor wafer of claim 1, wherein the epitaxial layer further comprises an unintentionally doped epitaxial layer and the unintentionally doped epitaxial layer is in direct contact with the last oxygen-doped material layer.

6. The semiconductor wafer of claim 1, wherein oxygen concentrations of the oxygen-doped material layers gradually decrease along a direction from the substrate to the epitaxial layer, such that a lattice constant of a first oxygen-doped material layer in direct contact with the substrate substantially matches a lattice constant of the substrate, and that a lattice constant of a last oxygen-doped material layer in direct contact with the epitaxial layer substantially matches a lattice constant of the epitaxial layer.

7. The semiconductor wafer of claim 1, wherein a thickness of the semiconductor material layers is greater than a thickness of the oxygen-doped semiconductor material layers.

8. The semiconductor wafer of claim 1, wherein the buffer layer including a plurality of deposition cycles, each deposition cycle except a last deposition cycle includes one of the semiconductor material layers and one of the oxygen-doped material layers, and a thickness of each deposition cycle except a last deposition cycle is from about 4 nanometers (nm) to about 10 nm.

9. A light-emitting diode (LED) chip, comprising:
   a sapphire substrate;
   a buffer layer deposited on the sapphire substrate, the buffer layer including a plurality of aluminum nitride (AlN) layers and a plurality of oxygen-containing AlN layers, the AlN layers and the oxygen-containing AlN layers deposited in an alternating arrangement on top of each other, wherein the buffer layer releases a stress between the buffer layer and the sapphire substrate, the plurality of oxygen-containing AlN layers include a last oxygen-containing AlN layer, and a thickness of the last oxygen-containing AlN layer is no greater than the thickness of the AlN layers; and
   an epitaxial layer including gallium nitride (GaN) above the buffer layer, wherein the last oxygen-containing AlN layer is in direct contact with the epitaxial layer, and wherein an oxygen concentration of each oxygen-containing AlN layer of the plurality of oxygen-containing AlN layers gradually decreases along a direction from the substrate to the epitaxial layer.

10. The LED chip of claim 9, wherein the buffer layer includes a first oxygen-containing AlN layer among the plurality of oxygen-containing AlN layers, and the first oxygen-containing AlN layer is in direct contact with the sapphire substrate.

* * * * *